(12) United States Patent
Meyer et al.

(10) Patent No.: US 8,941,206 B2
(45) Date of Patent: Jan. 27, 2015

(54) SEMICONDUCTOR DEVICE INCLUDING A DIODE AND METHOD OF MANUFACTURING A SEMICONDUCTOR DEVICE

(75) Inventors: Thorsten Meyer, Munich (DE); Andreas Meiser, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 91 days.

(21) Appl. No.: 13/556,261

(22) Filed: Jul. 24, 2012

(65) Prior Publication Data

US 2014/0027773 A1 Jan. 30, 2014

(51) Int. Cl.
*H01L 23/58* (2006.01)
*H01L 29/06* (2006.01)

(52) U.S. Cl.
CPC ............... *H01L 29/0619* (2013.01)
USPC .......................... 257/491; 438/218

(58) Field of Classification Search
CPC ................................. H01L 29/0619
USPC ............................. 257/491
See application file for complete search history.

(56) References Cited

U.S. PATENT DOCUMENTS

| 2002/0177277 | A1* | 11/2002 | Baliga | 438/268 |
| 2009/0008723 | A1* | 1/2009 | Schmidt | 257/409 |
| 2013/0153916 | A1* | 6/2013 | Weyers et al. | 257/73 |

* cited by examiner

*Primary Examiner* — Ajay K Arora
(74) *Attorney, Agent, or Firm* — Murphy, Bilak & Homiller, PLLC

(57) ABSTRACT

A semiconductor device includes a transistor cell array in the semiconductor body of a first conductivity type. The semiconductor device further includes a first trench in the transistor cell array between transistor cells. The first trench extends into the semiconductor body from a first side and includes a pn junction diode electrically coupled to the semiconductor body at a sidewall.

25 Claims, 21 Drawing Sheets

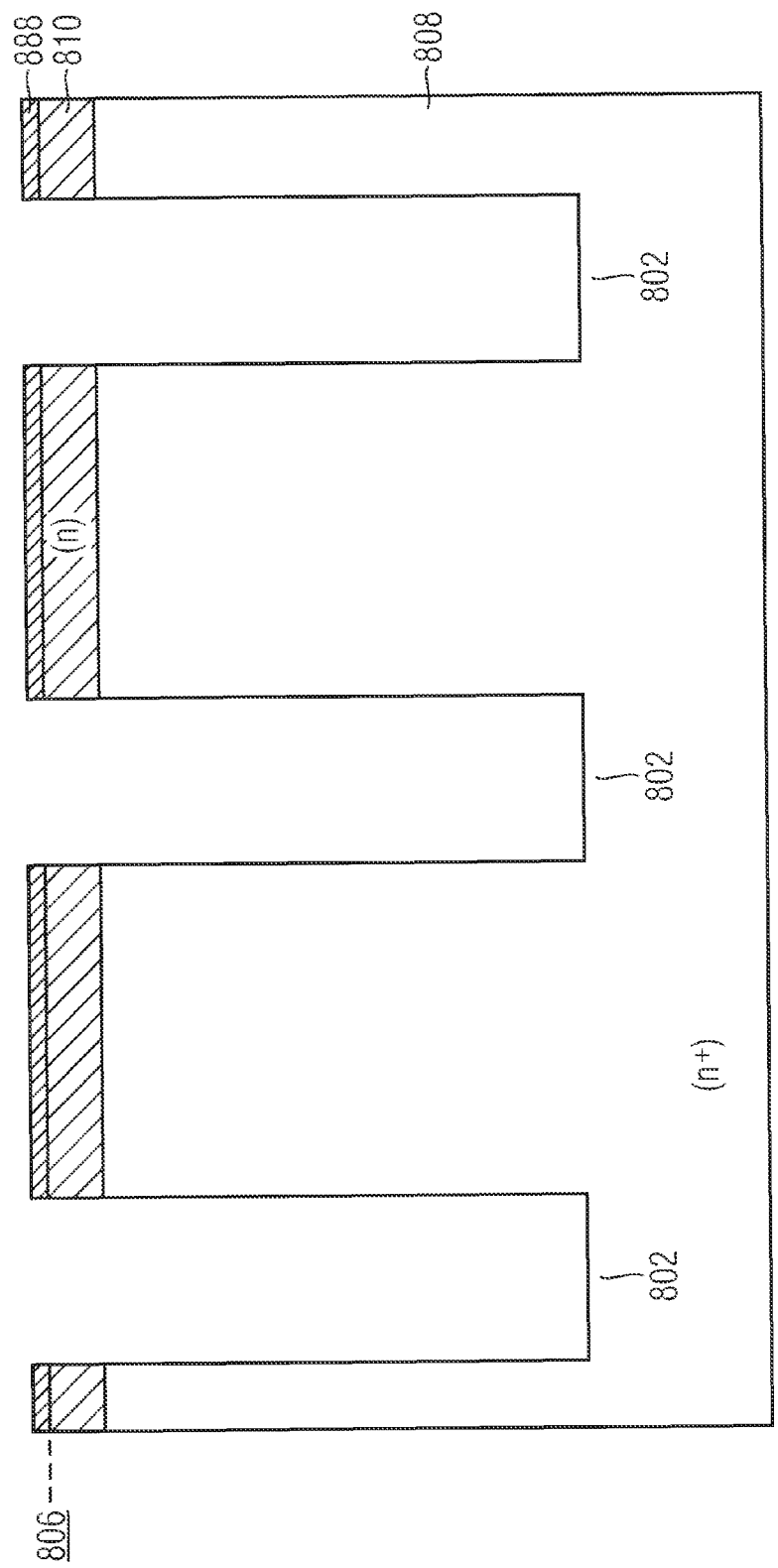

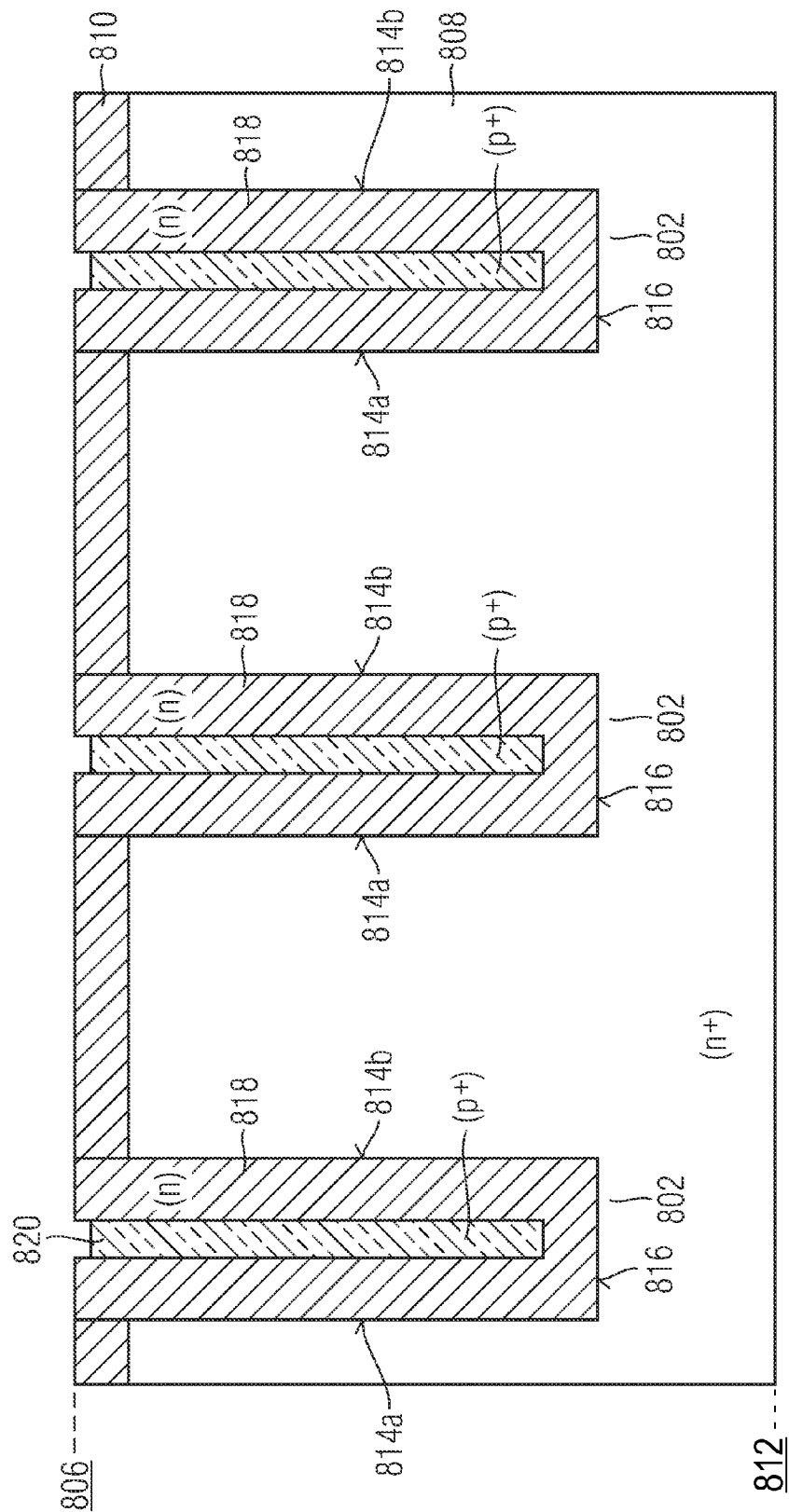

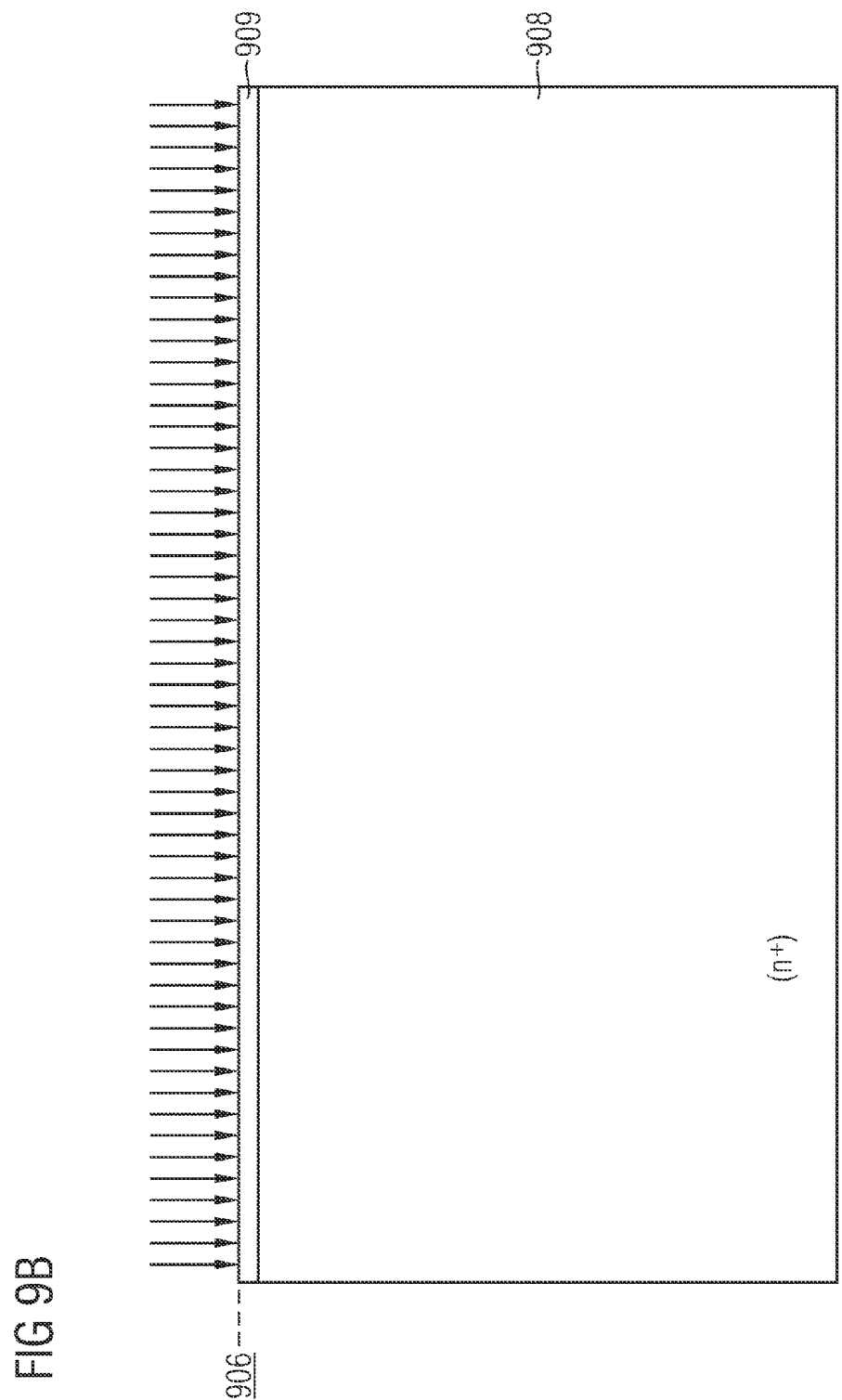

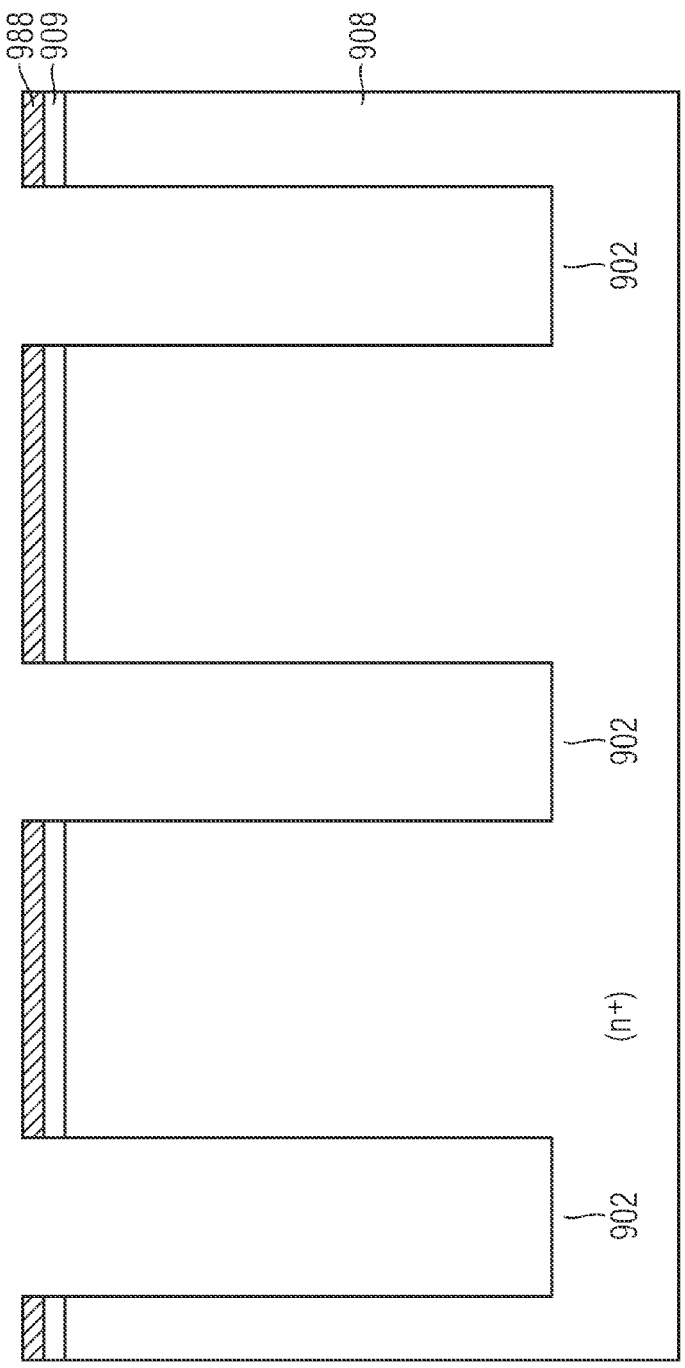

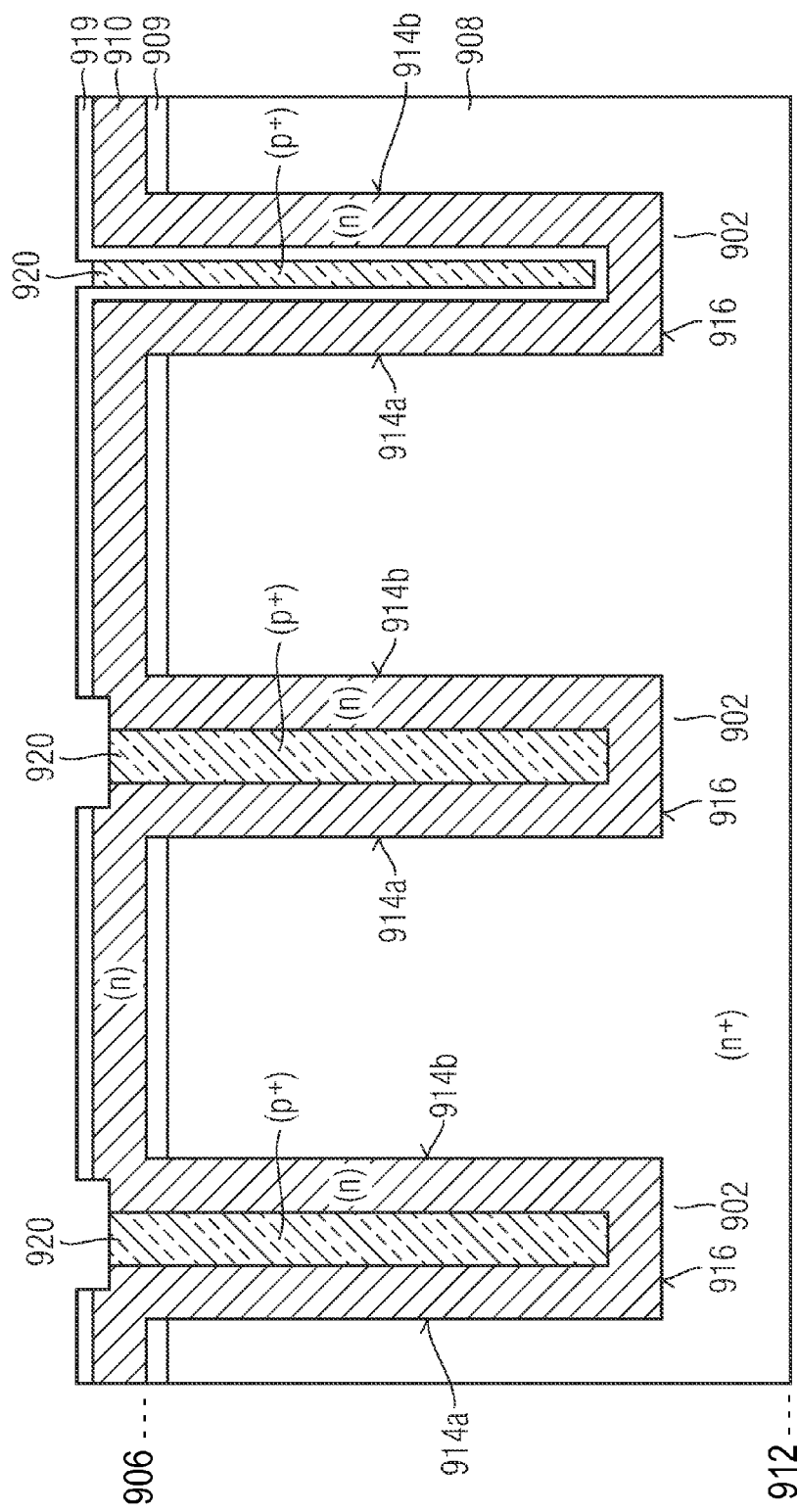

SEMICONDUCTOR DEVICE INCLUDING A DIODE AND METHOD OF MANUFACTURING A SEMICONDUCTOR DEVICE

BACKGROUND

One goal of development of new semiconductor technologies lies in further size reduction of semiconductor devices, e.g. transistor cells. When shrinking semiconductor devices, energy capability limitations have to be taken into account. As an example, power devices need to withstand short clamping or short circuit pulses. When shrinking device areas, these devices are required to dissipate an increasing energy density per unit area.

It is desirable to improve the capability of a semiconductor device to absorb pulse energy and to provide a method of manufacturing such a semiconductor device.

SUMMARY

According to an embodiment of a semiconductor device, the semiconductor device includes a transistor cell area in a semiconductor body a first conductivity type. The semiconductor device further includes a first trench in the transistor cell area between transistor cells. The trench extends into the semiconductor body from a first side and includes a pn junction diode electrically coupled to the semiconductor body at a sidewall.

According to an embodiment of a method of manufacturing a semiconductor device, the method includes forming a transistor cell area in a semiconductor body of a first conductivity type. The method further includes forming a first trench in the transistor cell area between transistor cells. The first trench extends into the semiconductor body from a first side and includes a pn junction diode electrically coupled to the semiconductor body at a sidewall.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and many of the intended advantages will be readily appreciated as they become better understood by reference to the following detailed description. The elements of the drawings are not necessarily to scale relative to each other. Like reference numerals designate corresponding similar parts.

FIGS. 8A to 8H illustrate schematic cross-sectional views of a semiconductor substrate running through processes of one embodiment of manufacturing a semiconductor device including a pn junction diode in a trench.

FIGS. 9A to 9G illustrate schematic cross-sectional views of a semiconductor substrate running through processes of one embodiment of manufacturing a semiconductor device including a pn junction diode in a first trench and dielectric isolation in a second trench.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, corresponding elements have been designated by the same references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

Figure 1:
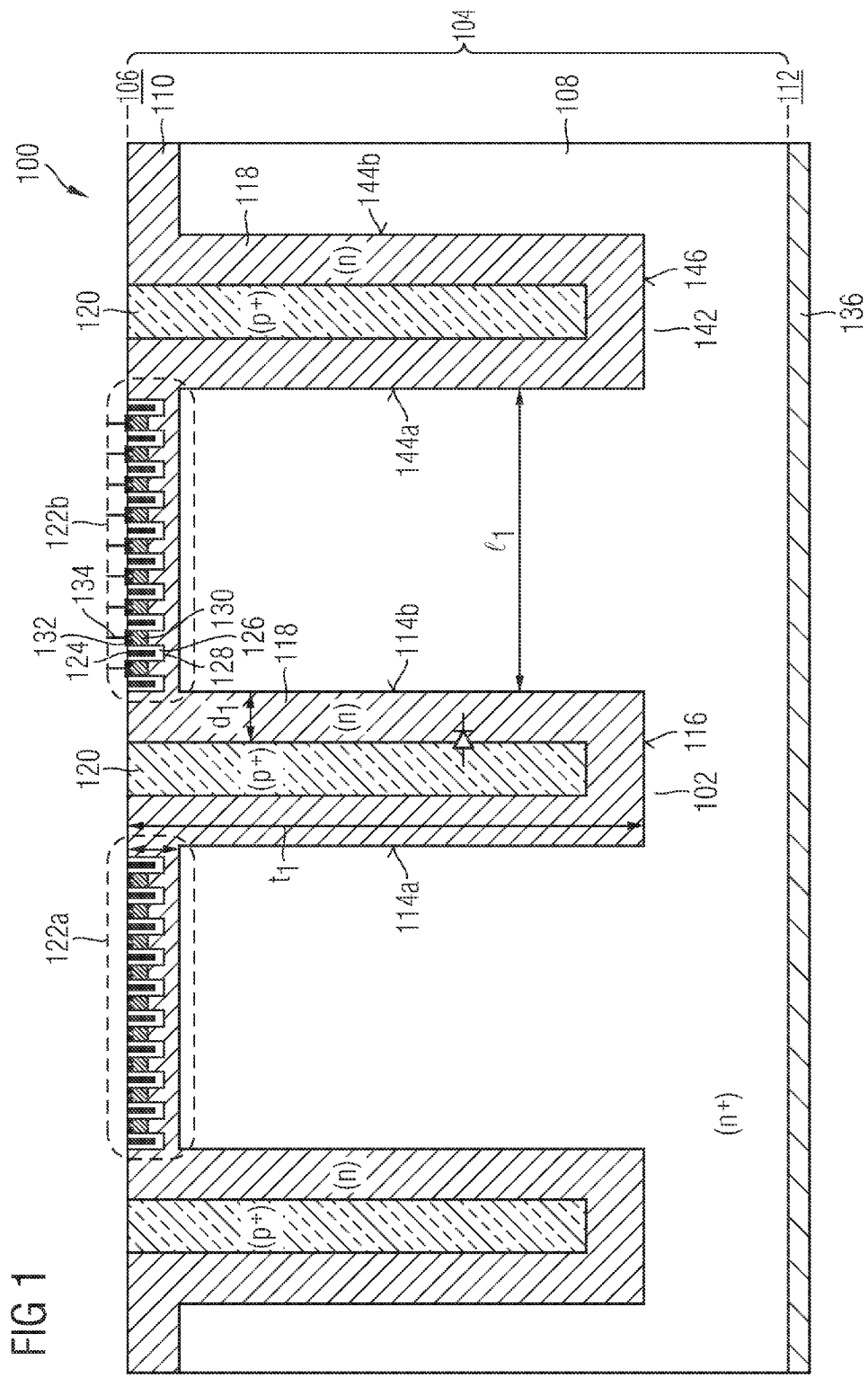
FIG. 1 illustrates a cross-sectional view of one embodiment of a vertical power transistor device including a pn junction diode in a trench.

FIG. 1 illustrates a cross-sectional view of one embodiment of a vertical semiconductor device 100, e.g. a power transistor device. The vertical semiconductor device 100 includes a first trench 102 extending into a semiconductor body 104 from a first side 106. In the exemplary embodiment illustrated in FIG. 1, the semiconductor body 104 includes a highly doped semiconductor substrate 108 of a first conductivity type, e.g. a silicon substrate or a semiconductor compound substrate, and a semiconductor layer 110 of the first conductivity type thereon. In the illustrated embodiment, the highly doped semiconductor substrate 108 is a highly n-doped, i.e. n$^+$-doped or highly p-doped silicon substrate including a concentration of dopants in the range of $10^{18}$ cm$^{-3}$ to $5 \times 10^{20}$ cm$^{-3}$. The highly doped substrate 108 is beneficial in terms of low resistivity of a current path from the first side 106 to a second side 112 opposite to the first side 106, e.g. a low-ohmic current path between a source contact and a drain contact of a field effect transistor (FET).

The first trench 102 includes a pn junction diode electrically coupled to the n$^+$-doped substrate 108 via sidewalls 114a, 114b and a bottom side 116. The pn junction diode includes a first n-doped semiconductor layer 118 lining the sidewalls 114a, 114b and the bottom side 116 of the first trench 102. The pn junction diode further includes a p$^+$-doped semiconductor layer 120 adjoining the first n-doped semiconductor layer 118.

As an example, the p$^+$-doped semiconductor layer 120 may be a p$^+$-doped polysilicon layer. According to an embodiment, the first n-doped semiconductor layer 118 is an epitaxial silicon layer that is doped in-situ, i.e. during layer formation, or after layer formation by ion implantation of dopants and subsequent dopant activation. According to one embodiment, the n-doped semiconductor layer 110 and the n-doped semiconductor layer 118 are formed simultaneously and thus include a same level of doping. According to another embodiment, the n-doped semiconductor layer 110 and the n-doped semiconductor layer 118 may be formed one after another.

According to an embodiment, a maximum doping concentration of each of the n-doped semiconductor layers 110, 118 is in a range of $10^{15}$ cm$^{-3}$ to $5 \times 10^{17}$ cm$^{-3}$. Variation of the maximum doping concentration of the first n-doped layer 118 as well as variation of a thickness $d_1$ of this layer allow to adjust a breakdown voltage of pn junction diode in the first trench 102.

A depth $t_1$ of the first trench 102, i.e. an extension of the first trench 102 into the semiconductor body 104 from the first side 106 may range between 20 μm and 250 μm. Increasing the depth $t_1$ of the first trench 102 allows to increase a breakdown area of the pn junction diode at the sidewalls 114a, 114b in the first trench 102. In other words, the current capability of the pn junction diode in the first trench 102 can be increased by this measure.

The first trench 102 is located between a first part 122a of a transistor cell array and a second part 122b of the transistor cell array. The first and second parts 122a, 122b each include at least one transistor cell. As an illustrative example, the transistor cell of FIG. 1 is a trench transistor cell including a gate electrode 124 and a dielectric 126 in a trench 128 extending into the n-doped semiconductor layer 110 from the first side 106. Each of the transistor cells further includes a p-doped body region 130 and an n$^+$-doped source region 132. The part of the p-doped body region 130 that is located between the source region 132 and the n-doped semiconductor layer 110 adjoins a sidewall of the trench 128 constitutes a channel region of the transistor cell. A conductivity of this channel region can be controlled via a voltage applied to the gate electrode 124 in the trench 128. The p-doped body region 130 and the n$^+$-doped source region 132 are electrically coupled to a contact 134 at the first side 106. A drain contact 136 is located at a second side 112 and a direction of current flow is a vertical direction between the source contact 134 at the first side 106 and the drain contact 136 at the second side 112.

According to an embodiment, a breakdown voltage $V_{br1}$ of the pn junction diode in the first trench 102 is smaller than a breakdown voltage $V_{br2}$ between the body region 130 that is electrically coupled to the source contact 134 and the n$^+$-doped substrate 108 that is electrically coupled to the drain contact 136.

Since the pn junction diode in the first trench 102 is integrated in the transistor cell area and thus shares a same volume of the n$^+$-doped substrate 108 for current conduction and heat dissipation, a compact and effective measure for energy pulse dissipation is provided. By adjusting the breakdown voltage $V_{br1}$ of the pn junction diode in the first trench 102 smaller than the breakdown voltage $V_{br2}$ between drain and source of the transistor cells to be protected, reliability of protection of the transistor cells can be further improved.

According to an embodiment, the second p$^+$-doped semiconductor layer 120, i.e. an anode of the pn junction diode, may be electrically coupled to the p-doped body region of the transistor cells.

The vertical power device 100 may further comprise a second trench 142 extending into the semiconductor body 104 from the first side 106. Similar to the first trench 102, the second trench 142 includes a pn junction diode electrically coupled to the n$^+$-doped substrate 108 via sidewalls 144a, 144b and a bottom side 146 of the second trench 142. Similar to the pn junction diode in the first trench 102, the pn junction diode in the second trench 142 includes the first n-doped semiconductor layer 118 and the second p$^+$-doped semiconductor layer 120. According to an embodiment, a lateral distance $l_1$ between the first trench 102 and the second trench 142 ranges between a thermal diffusion length of a material of the semiconductor body 104 and five times the thermal diffusion length of the material of the semiconductor body 104 for a given pulse. In case of a semiconductor body made of silicon, the lateral distance $l_1$ may range between 20 μm and 200 μm. The lateral distance $l_1$ may also be adjusted in consideration of pulse duration and pulse energy to be absorbed by the pn junction diodes in the first and second trenches 102, 142, respectively, for example.

Apart from the advantage that the pulse energy capability of the pn junction diodes can be increased by increasing the depth $t_1$ of the first and second trenches 102, 142, the integration of the pn junction diodes into the transistor cell area has the further benefit that less optimizations with regard to avalanche robustness of the transistor cells have to be taken, because the pn junction diodes can be constructed such that these diodes will reliably go into electrical breakdown before the transistor cells.

Figure 2:
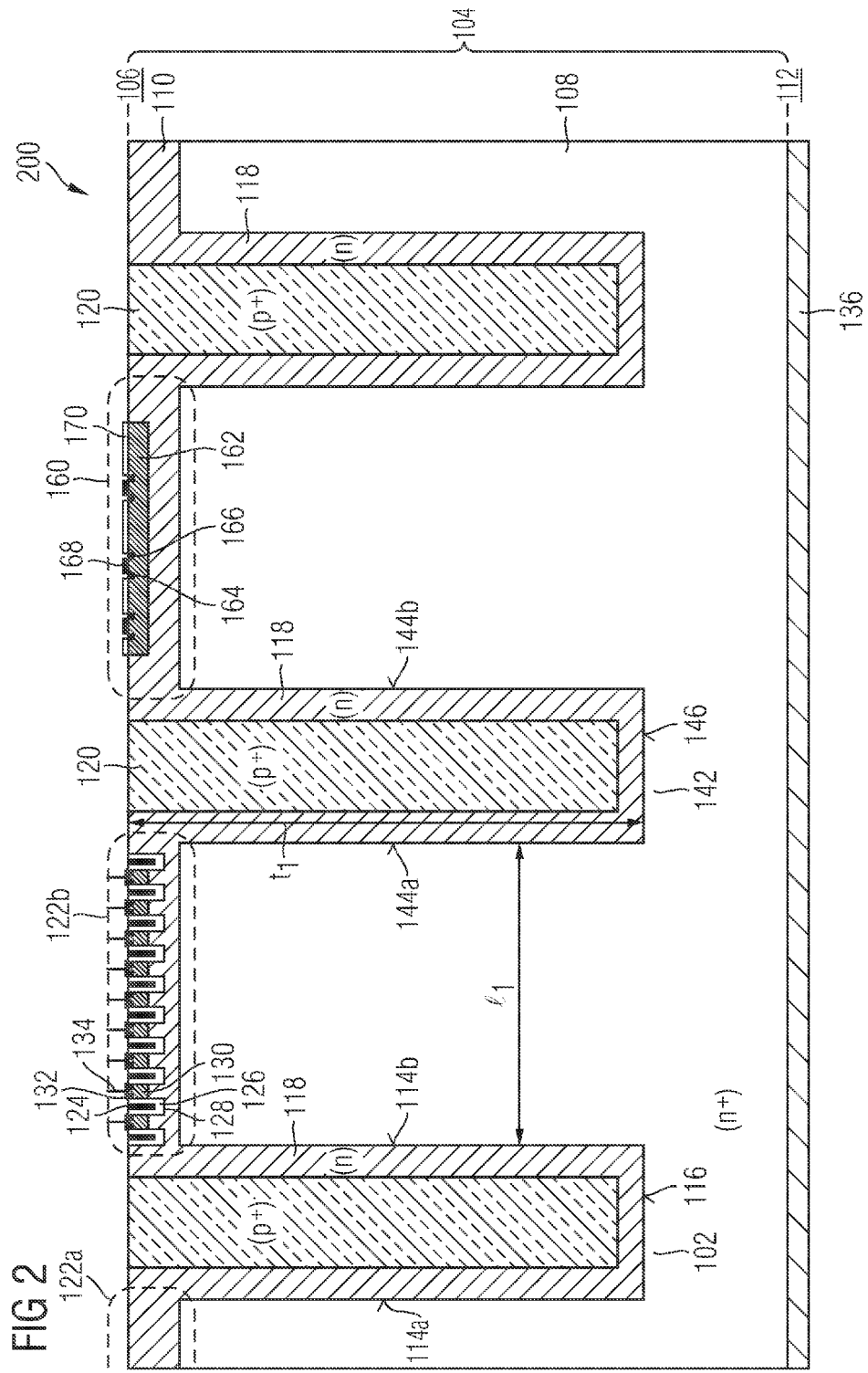
FIG. 2 illustrates a cross-sectional view of one embodiment of an integrated circuit including a power transistor device with a pn junction diode in a trench.

FIG. 2 illustrates a cross-sectional view of an integrated circuit 200 according to an embodiment. Similar to the vertical semiconductor device 100 illustrated in FIG. 1, the integrated circuit 200 includes a semiconductor body 104 and a vertical semiconductor device therein. As regards a design of the vertical power device, reference is taken to the embodiment illustrated in FIG. 1 and the related part of the description above.

The integrated circuit 200 further includes an integrated circuit block 160 that is formed in a part of the n-doped semiconductor layer 110 outside of the transistor cell array. As an example, the circuit block 160 may include digital or analog circuit blocks or a combination thereof. For illustration purposes, planar FETs are shown as part of the circuit block 160. The planar FETs include a p-doped body region 162, n+-doped source and drain regions 164, 166 and a planar gate structure 168 on the first side 106. Further, a dielectric 170 is arranged on the first side 106 of the semiconductor body 104.

The planar FETs of FIG. 2 are for illustrative purposes only. Further passive and/or active elements may be used in the circuit block 160 in combination to form a functional circuit block, e.g. a digital and/or analog circuit block.

Figure 3:
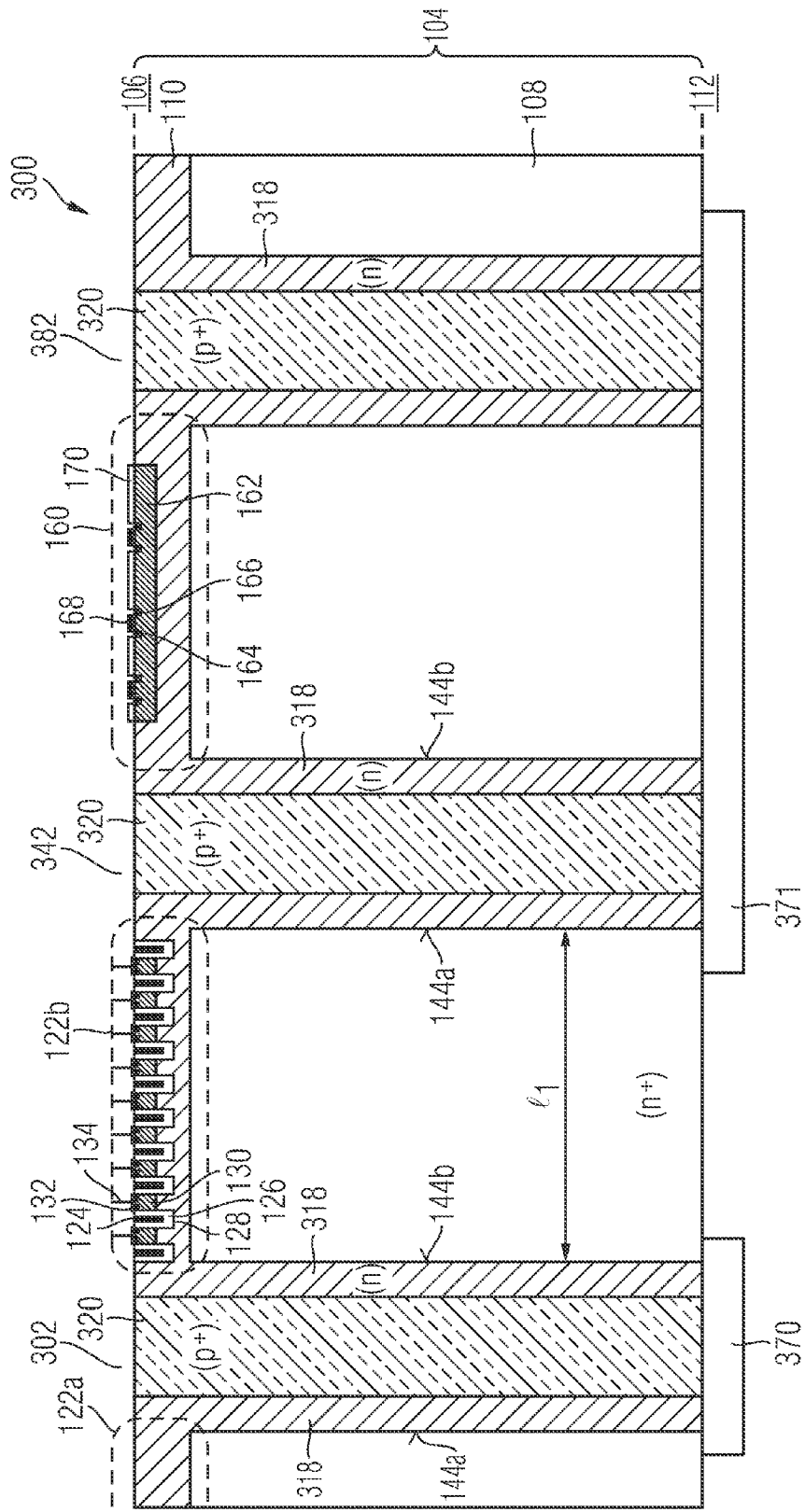
FIG. 3 illustrates a cross-sectional view of one embodiment of an integrated circuit including a power transistor device with a pn junction diode in a trench extending through a semiconductor substrate.

FIG. 3 illustrates a schematic cross-sectional view of one embodiment of an integrated circuit including a power transistor device and a pn junction diode in a trench.

Similar to the integrated circuit 200 illustrated in FIG. 2, the integrated circuit 300 includes parts 122a, 122b of the transistor cell area in the n-doped semiconductor layer 110 on the n+-doped substrate 108.

Whereas the first and second trenches 102, 142 illustrated in FIG. 2 end in the n+-doped substrate, a first trench 302 extends through the n-doped semiconductor layer 110 and the n+-doped substrate 108 from the first side 106 to the second side 112. The first trench 302 is located between the first part 122a of the transistor cell array and the second part 122b of the transistor cell array.

A first n-doped semiconductor layer 318 lines sidewalls 144a, 144b of the first trench 302. A second p+-doped semiconductor layer 320 is located between the first n-doped semiconductor 318 at opposing sidewalls 144a, 144b. The first n-doped semiconductor layer 318 and the second p+-doped semiconductor layer 320 constitute a pn junction in the first trench 302. A bottom side of the first n-doped semiconductor layer 318 and the second p+-doped semiconductor layer 320 at the second side 112 adjoins a first dielectric part 370, e.g. an oxide.

Similar to the first trench 302, a second trench 342 includes the first n-doped semiconductor layer 318 and the second p+-doped semiconductor layer 320. The second trench 342 is located between the second part 122b of the transistor cell array and the circuit block 160. The second trench 342 and a third trench 382 including the first n-doped semiconductor layer 318 and the second p+-doped semiconductor layer 320 limit the circuit block 160 along a lateral direction parallel to the first side 106.

A second dielectric part 371 is arranged at the second side 112 adjoining bottom sides of the second and third trenches 342, 382 as well as a bottom side of the n+-doped substrate 108 between the second and third trenches 342, 382. Thus, the second dielectric part 371 electrically insulates the circuit block 160 at the second side. The pn junction diodes in the second and third trenches 342, 382, i.e. the first n-doped semiconductor layer 318 and the second p+-doped semiconductor layer 320, constitute pn junction isolations. In other words, the pn junction diode in the second trench 342 provides a lateral electric isolation between the circuit block 160 and the second part 122b of the transistor cell array. Likewise, the pn junction diode in the third trench 382 provides a lateral electric isolation between the circuit block 160 and another circuit block.

The pn junction diodes in the first to third trenches 302, 342, 382 are beneficial in several respects. Whereas the pn junction diodes in the first and second trenches 302, 342 allow to efficiently absorb pulse energy, the pn junction diodes in the second and third trenches 342, 382 also provide a lateral electric isolation between analog and/or logic circuit blocks and/or circuit elements of the circuit block 160 and surrounding circuit blocks. As an example, the second p+-doped semiconductor layer 320 in the second and third trenches 342, 382 may be electrically coupled to a reference voltage pin, e.g. ground (GND), whereas the second p+-doped semiconductor layer 320 in the first trench 302 may be electrically coupled to an anode voltage, which may also correspond to GND or differ therefrom depending upon the circuit arrangement.

Figure 4:
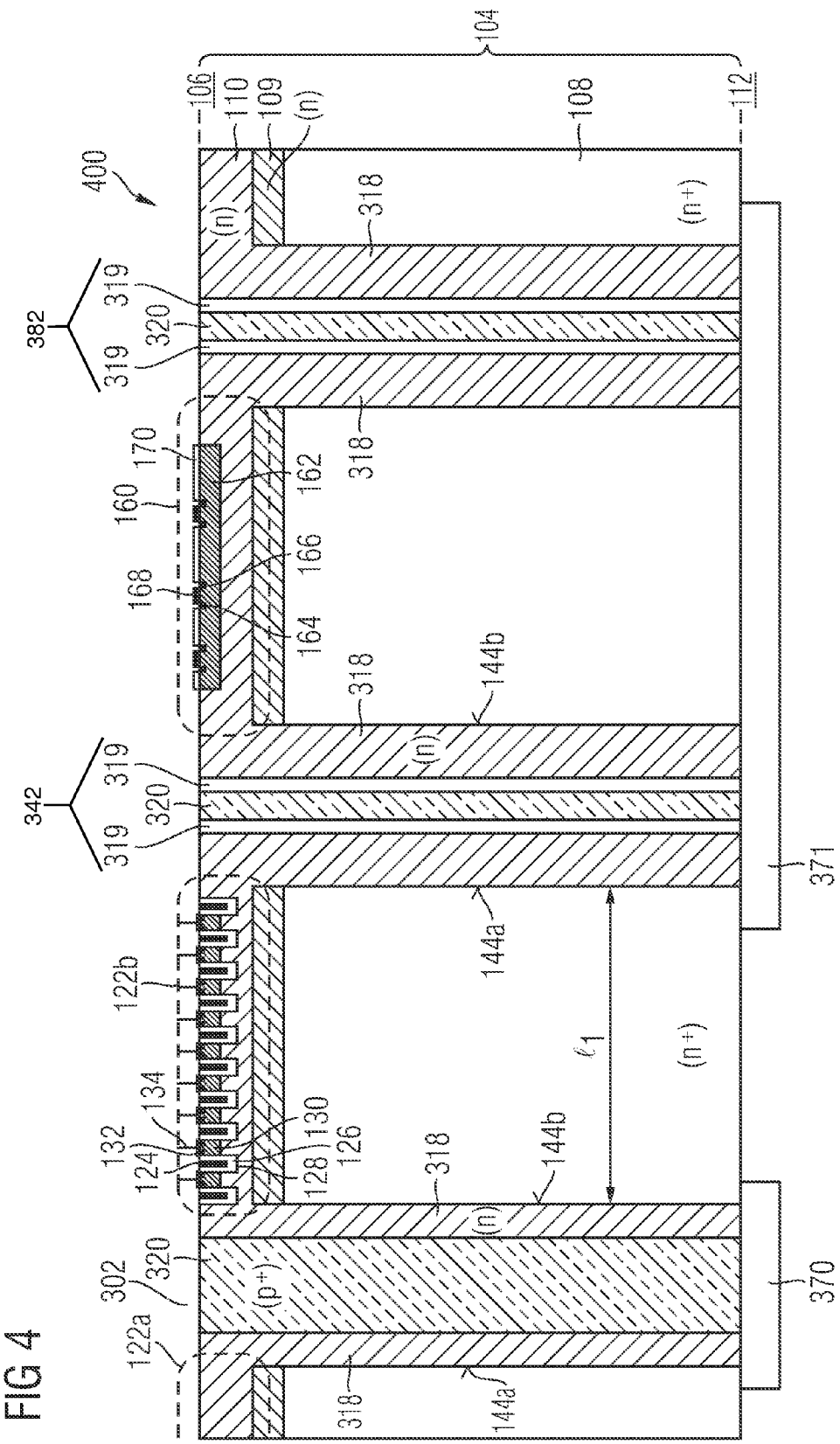
FIG. 4 illustrates a cross-sectional view of one embodiment of an integrated circuit including a power transistor device, a pn junction diode in a first trench extending through a semiconductor substrate and a dielectric isolation in a second trench extending through the semiconductor substrate.

FIG. 4 illustrates a schematic cross-sectional view of one embodiment of an integrated circuit including a power transistor device and a pn junction diode in a trench.

Similar to the integrated circuit 300 illustrated in FIG. 3, the integrated circuit 400 includes parts 122a, 122b of the transistor cell area in the n-doped semiconductor layer 110. As regards integrated circuit elements common to the integrated circuit 300 illustrated in FIG. 3 and the integrated circuit 400, reference is drawn to FIG. 3 and the related parts of the description above. A further n-doped semiconductor layer 109 is arranged between the n-doped semiconductor layer 110 and the n+-doped substrate 108. The further n-doped layer 109 includes a doping concentration lower than the n+-doped substrate 108. As an example, the further n-doped layer 109 is formed by implanting p-type dopants into a surface of the n+-doped substrate 108. As another or additional example, the further n-doped layer 109 is formed by layer deposition and doping. The further n-doped layer 109 improves adjusting the breakdown voltage $V_{br1}$ of the pn junction diode in the first trench 102 lower than the breakdown voltage $V_{br2}$ between source and drain of the transistor cells in the transistor cells array, e.g. the first and second parts 122a, 122b.

Other than the second and third trenches 342, 382 illustrated in FIG. 3, the second and third trenches 342, 382 illustrated in FIG. 4 include a dielectric 319 between the first n-doped layer 318 and the second p+-doped layer 320. Thus, the second and third trenches lack a pn junction isolation formed by the first n-doped layer 318 and the second p+-doped layer 320 but constitute a dielectric trench isolation. Since the second p+-doped layer 320 in the second and third trenches is electrically isolated from surrounding parts of the n+-doped substrate 108, a through contact between the first side 106 and the second side 112 is provided.

Figure 5:
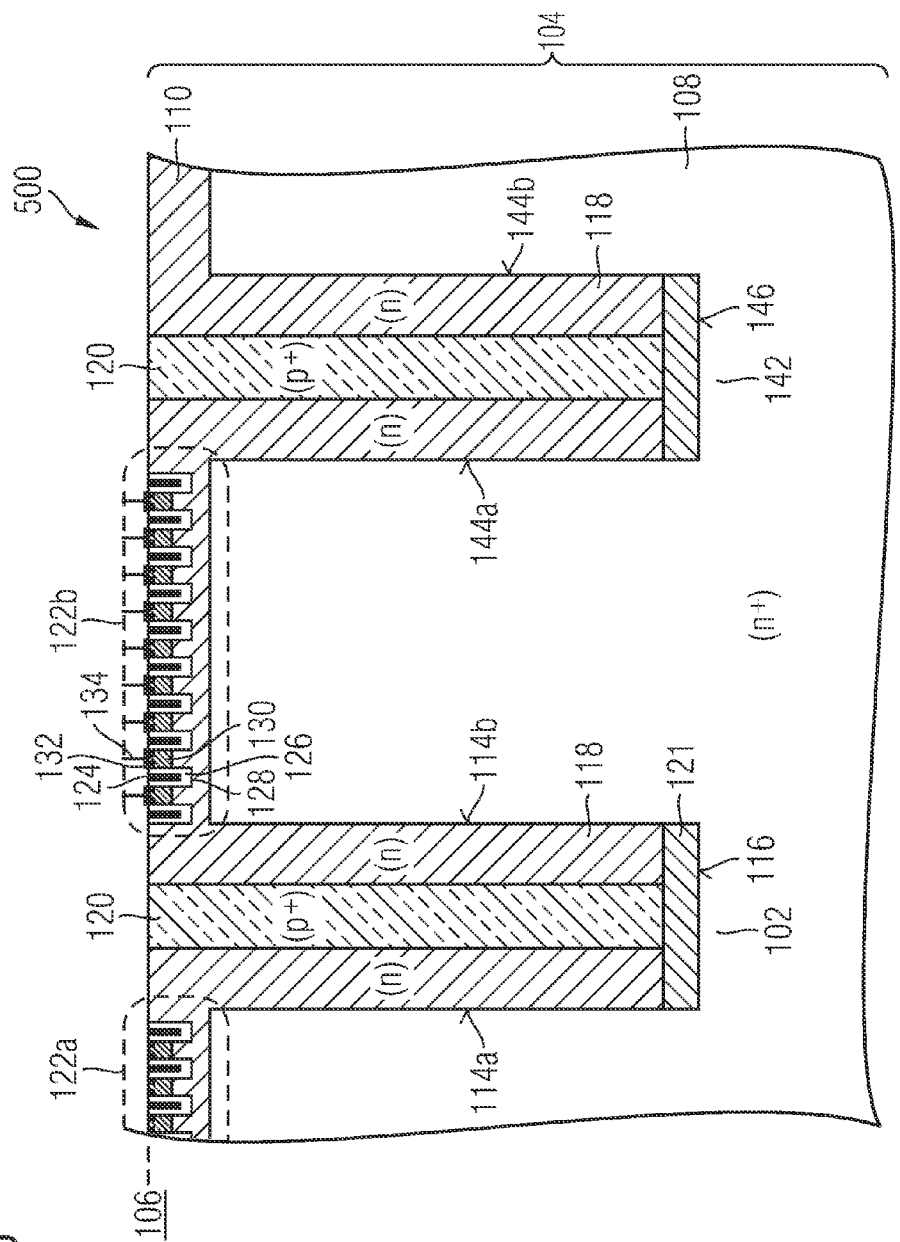
FIG. 5 illustrates a cross-sectional view of one embodiment of a vertical power transistor device including a pn junction diode in a trench and a dielectric at a bottom side of the trench.

FIG. 5 illustrates a schematic cross-sectional view of one embodiment of a vertical semiconductor device 500 including a pn junction diode in a trench.

Similar to the vertical semiconductor device 100 illustrated in FIG. 1, the vertical semiconductor device 500 includes parts 122a, 122b of the transistor cell area in the n-doped semiconductor layer 110. As regards device elements common to the vertical semiconductor device 100 illustrated in FIG. 1 and the vertical semiconductor device 500, reference is drawn to FIG. 1 and the related parts of the description above.

Other than the vertical semiconductor device 100 illustrated in FIG. 1, the vertical semiconductor device 500 includes a dielectric 121, e.g. an oxide at a bottom side of the first and second trenches 102, 142, respectively. The dielectric 121 may be beneficial with regard to avoiding electrical breakdown at or around a bottom side of the first and second trenches 102, 142, respectively. Further, the dielectric 121 may also act as an etch stop layer when removing the n+-doped semiconductor substrate 108 from the second side 112 ending up in a structure similar to FIGS. 3 and 4 with regard to an extension of the trenches through the n+-doped substrate 108.

Figure 6:
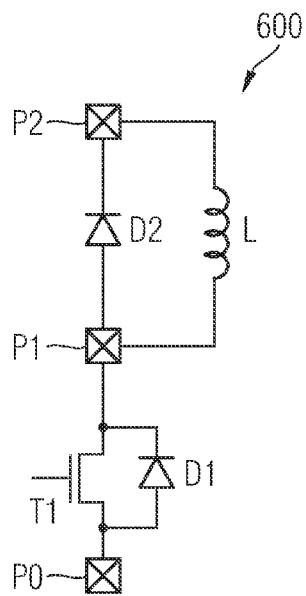
FIG. 6 illustrates one embodiment of a circuit switching an inductive load and including diodes D1 and D2 for power dissipation.

FIG. 6 schematically illustrates an equivalent circuit part of an integrated circuit 600 according to an embodiment. The integrated circuit includes a parallel connection of a transistor T1, e.g. an NMOSFET transistor (n-type channel Metal Oxide Semiconductor Field Effect Transistor) and a diode D1. The diode D1 is located in a cell array of the transistor T1. In more detail, the diode D1 is a pn junction diode in a trench located within the cell array of the transistor T1. Examples of an on-chip arrangement of the transistor T1 and the diode D1 are given in the embodiments above. The transistor T1 and the diode D1 are electrically coupled between reference pins P1 and P0, e.g. output (OUT) and GND. The diode D2 is electrically coupled between a pin P2 and the pin P1, e.g. supply (VBAT) and OUT. An exemplary load L illustrated as an inductive load in FIG. 6 is electrically coupled between the pins P2, P1 and thus connected in parallel to the diode D2. As an example, the load L may be a motor. Similar to the diode D1, also the diode D2 is a pn junction diode in a trench. Since the diodes D2 and D1 are at least in part coupled to different circuit pins, a pn junction isolation in a trench as illustrated in FIG. 3 or a dielectric isolation in a trench as illustrated in FIG. 4 may provide a lateral electric isolation between the diodes D1, D2.

Figure 7:
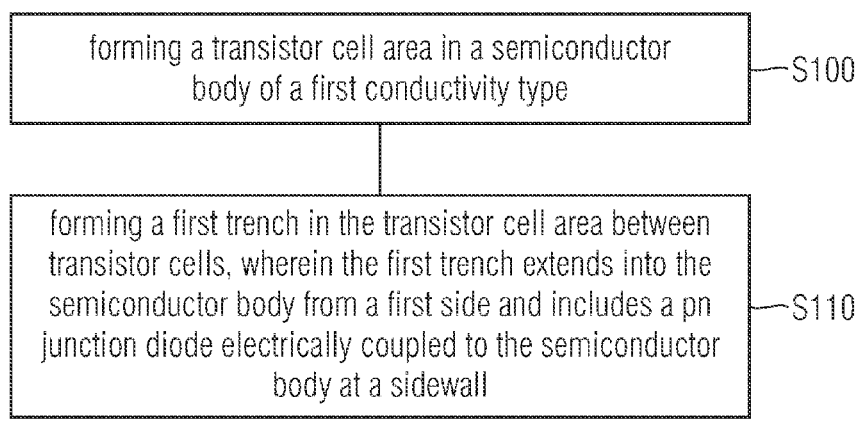
FIG. 7 illustrates one embodiment of a process flow of manufacturing a semiconductor device including a pn junction diode in a trench.

FIG. 7 illustrates a simplified process flow a method of manufacturing a semiconductor device.

The method includes, at S100, forming a transistor cell array in a semiconductor body of a first conductivity type. The method further includes, at S110, forming a first trench in the transistor cell array between transistor cells, wherein the first trench extends into the semiconductor body from a first side and includes a pn junction diode electrically coupled to the semiconductor body at a sidewall.

FIGS. 8A to 8H illustrate schematic cross-sectional views of an n$^+$-doped substrate 808 at different periods during manufacture of a vertical semiconductor device according to an embodiment.

Figure 8A:
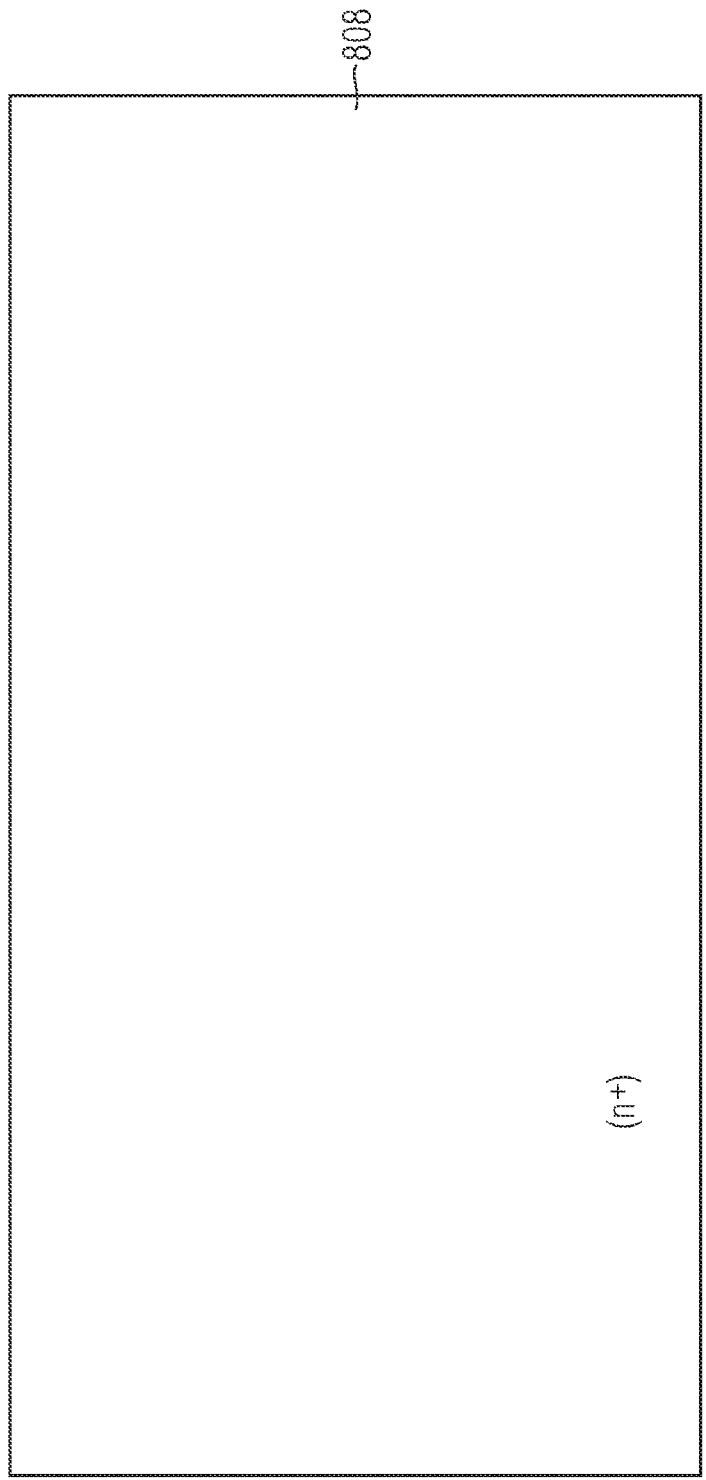
Figure 8B:
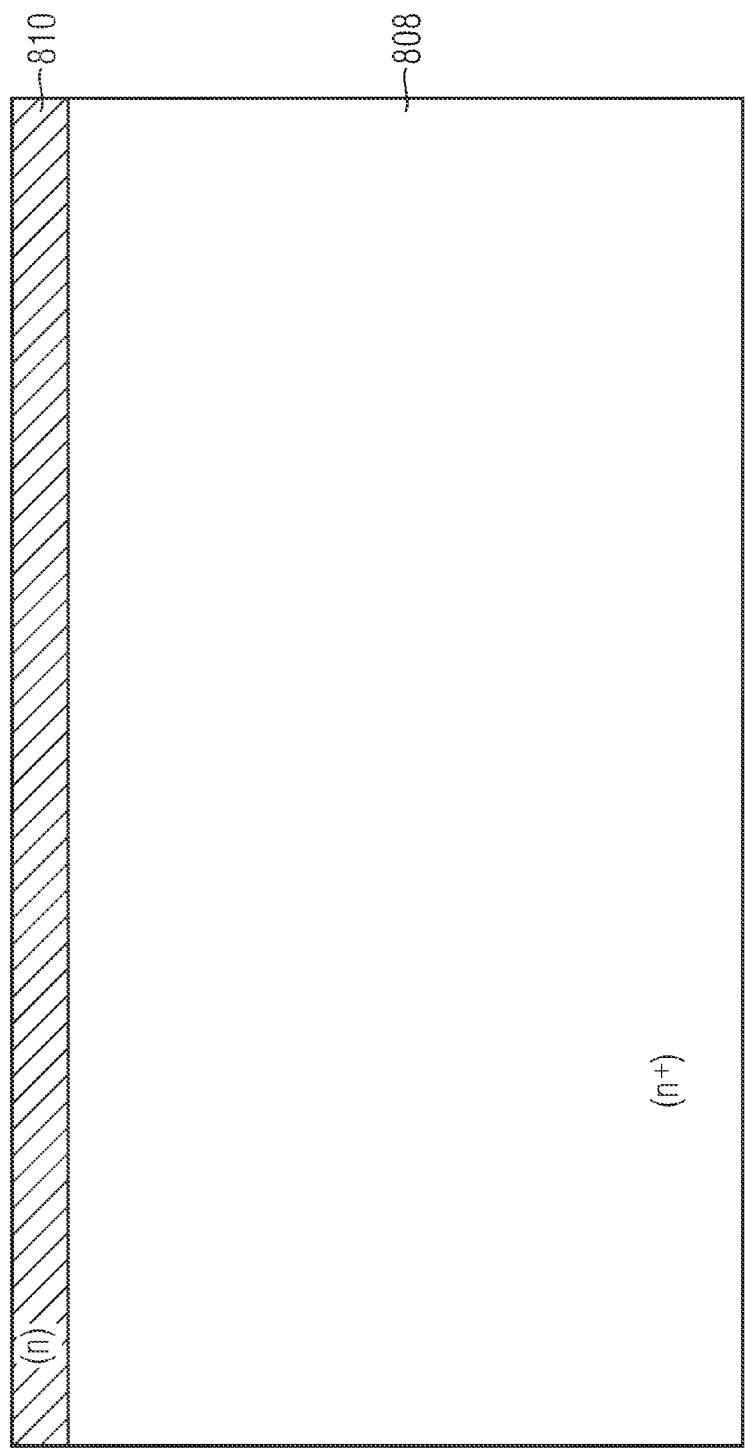

A n$^+$-doped substrate 808, e.g. n$^+$-doped silicon substrate including a doping concentration of e.g. at least $10^{18}$ cm$^{-3}$, as illustrated in FIG. 8A is subject to n-doped layer formation on a surface thereof, as illustrated in FIG. 8B. A n-doped semiconductor layer 810 is formed on the n$^+$-doped substrate 808. As an example, the n-doped semiconductor layer 810 may be formed by epitaxial growth using an appropriate process, e.g. chemical vapor deposition (CVD).

Figure 8C:
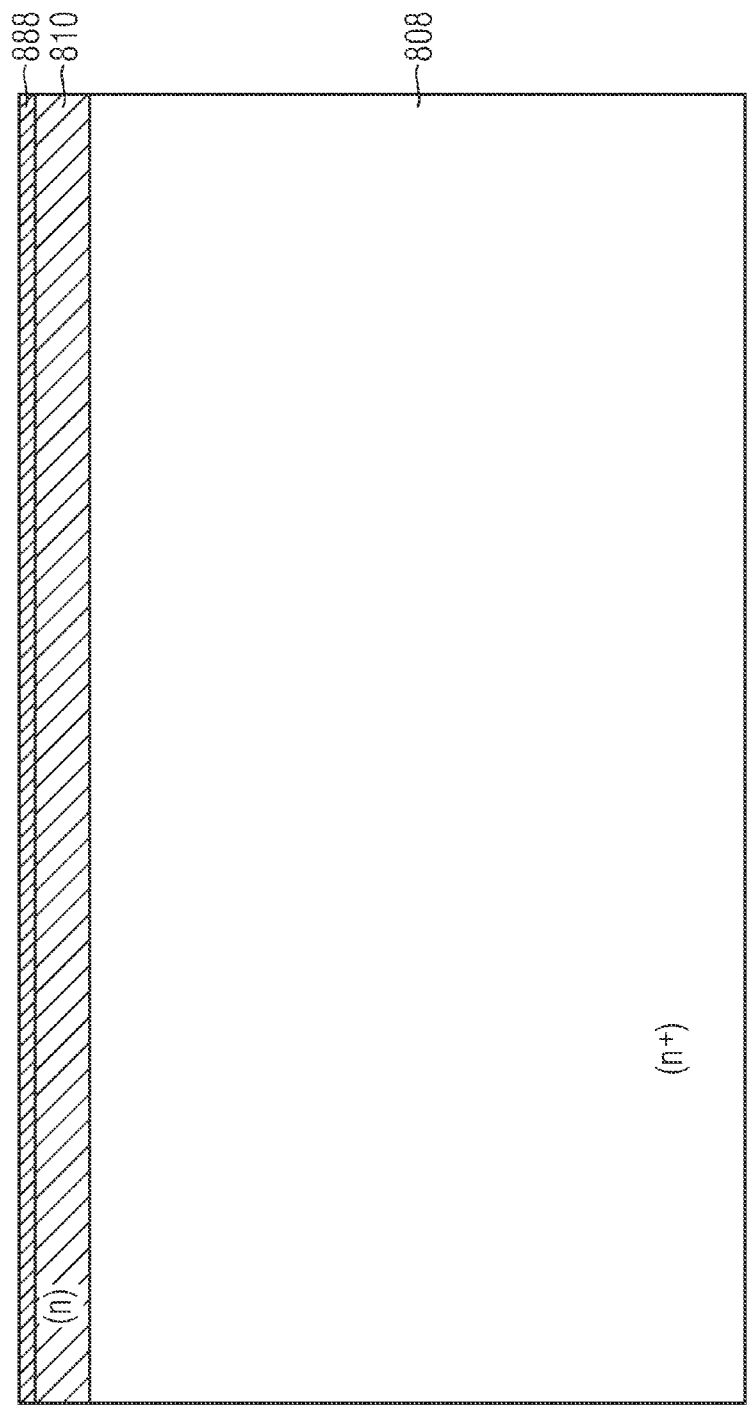

Referring to the schematic cross-sectional view of the n$^+$-doped substrate of FIG. 8C, a mask layer 888, e.g. a hard mask layer is formed on the n-doped semiconductor layer 810. A material of the mask layer 888 may be appropriately chosen such that the n-doped semiconductor layer 810 and the n$^+$-doped substrate 808 can be selectively etched.

Referring to the schematic cross-sectional view of the n$^+$-doped substrate 808 illustrated in FIG. 8D, the mask layer 888 is patterned, e.g. by lithography and etching. Then, the n-doped semiconductor layer 810 and the n$^+$-doped substrate 808 are etched in those regions of the mask layer 888 that have previously been removed. As an example, etching of the n-doped semiconductor layer 810 and the n$^+$-doped substrate 808 may be carried out as anisotropic etching using an appropriate method, e.g. dry etching. As a result of etching, trenches 802 are formed. The trenches 802 extend from a first side 806 through the n-doped semiconductor layer 810 into the n$^+$-doped substrate 808.

Figure 8E:
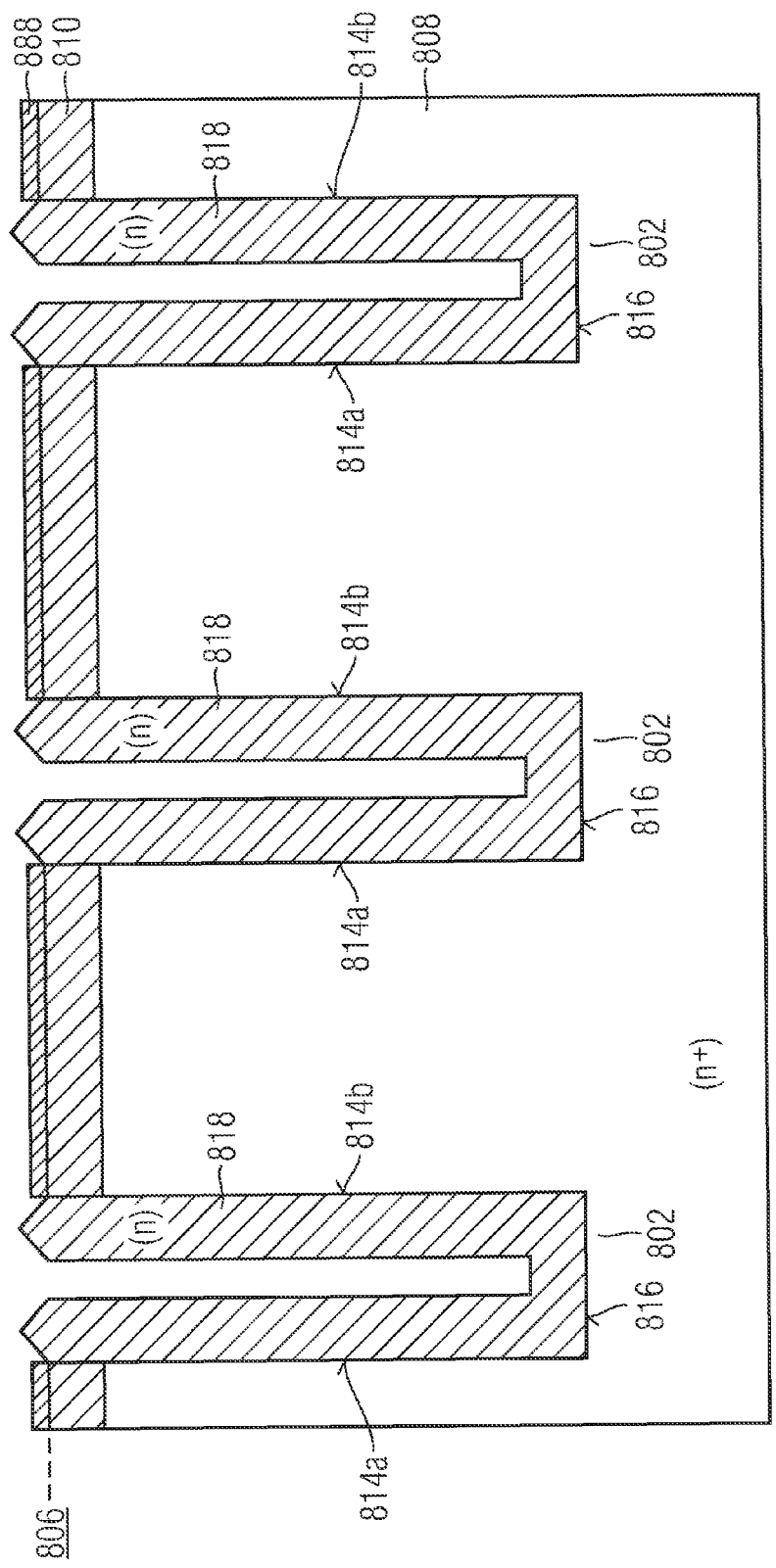

Referring to the schematic cross-sectional view of the n$^+$-doped substrate 808 illustrated in FIG. 8E, a first n-doped semiconductor layer 818 is formed on a sidewall 814a, 814b as well as on a bottom side 816 of each of the trenches 802. As an example, the first n-doped semiconductor layer 818 may be formed by selective epitaxial growth.

Figure 8F:
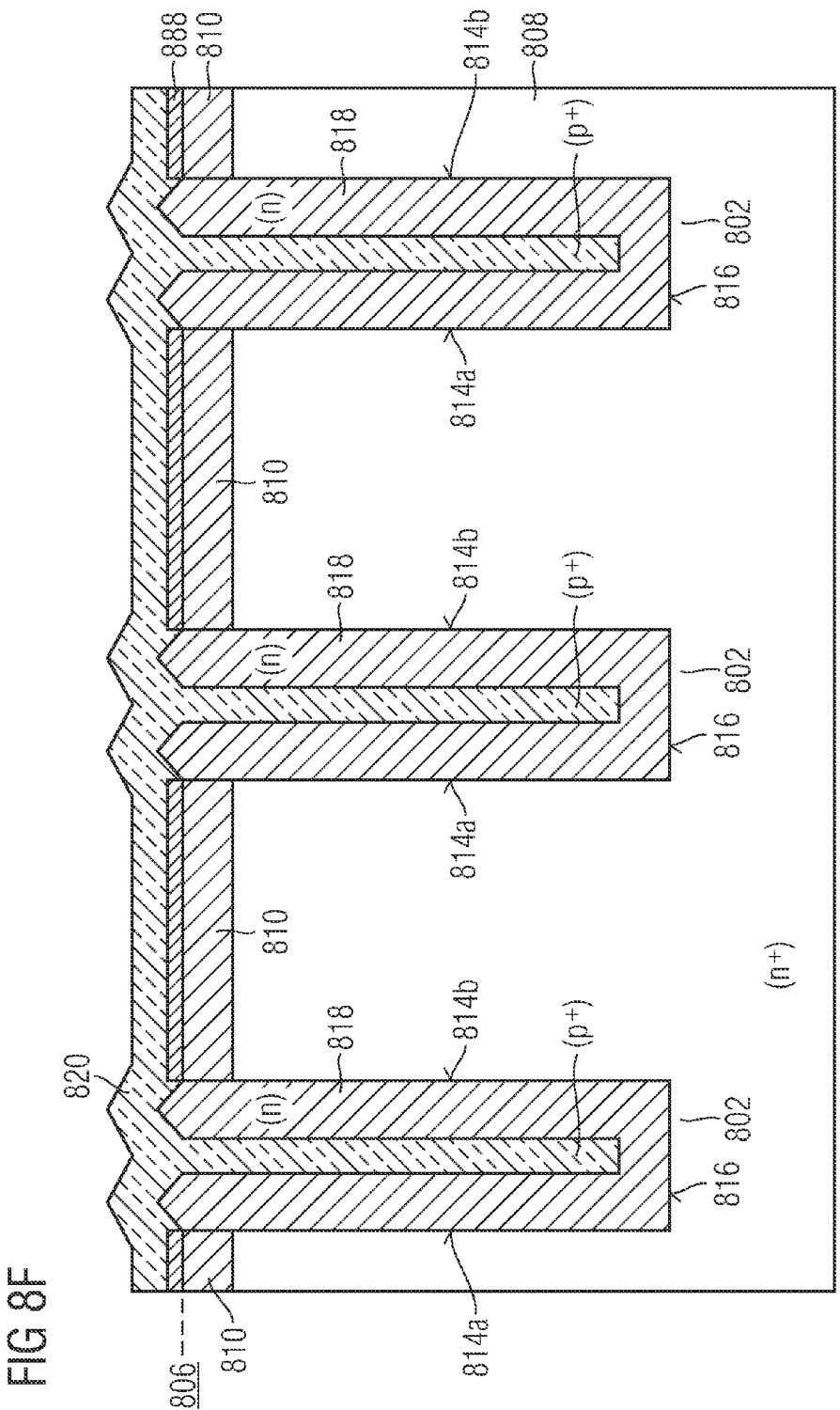

Referring to the schematic cross-sectional view of the n$^+$-doped substrate 808 illustrated in FIG. 8F, the trenches 802 are filled with a second p$^+$-doped semiconductor layer 820. As an example, the trenches 802 are filled with highly doped polysilicon or a layer stack of undoped and highly doped polysilicon.

Figure 8G:
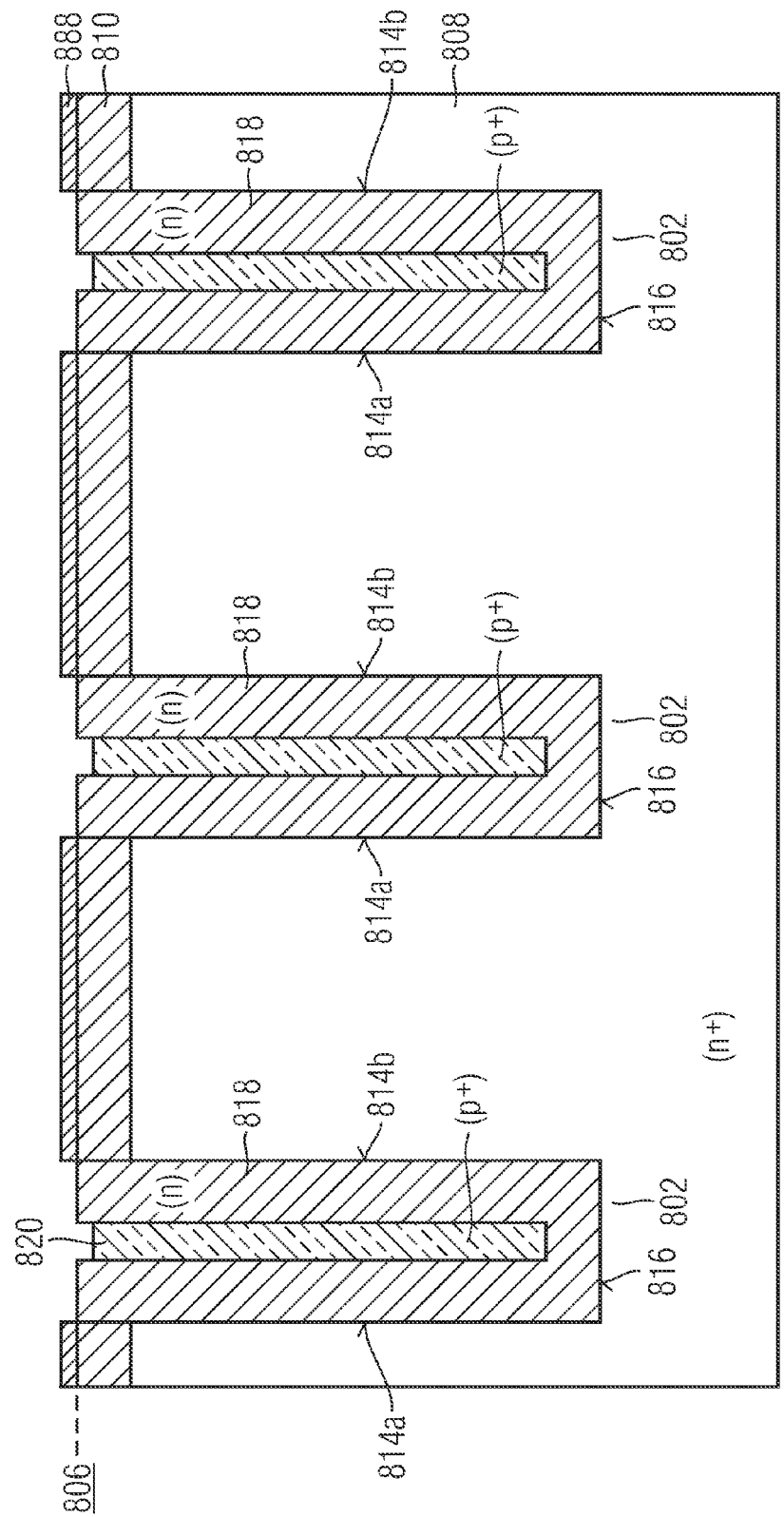

Referring to the schematic cross-sectional view of the n$^+$-doped substrate illustrated in FIG. 8G, the second p$^+$-doped semiconductor layer 820 is removed at the first side 806 and the first side 806 is planarized, e.g. by an appropriate method such as chemical-mechanical polishing (CMP), for example.

Referring to the schematic cross-sectional view of the n$^+$-doped substrate 808 illustrated in FIG. 8H, the mask layer 888 is removed at the first side 806 e.g. by an appropriate method such as etching. As an example, the mask layer 888 may be selectively etched.

Further process steps, e.g. formation of p- and/or n-doped semiconductor zones at the first side 806 for manufacturing transistor cells, e.g. parts 122a, 122b of a transistor cell array as illustrated in FIGS. 1 to 5, and other circuit blocks, e.g. circuit block 160 as illustrated in FIGS. 2 to 4, follow. Likewise, the n$^+$-doped substrate 808 may be processed at a second side 812 opposite to the first side 806. As an example, the n$^+$-doped substrate 808 may be partially removed up to a bottom side of the trenches 802 and further dielectrics may be applied at the second side to provide electrically insulated part of the n$^+$-doped semiconductor substrate 808 as illustrated in FIGS. 3 and 4. Further, conductive materials may be applied at the second side 812, for example.

FIGS. 9A to 9G illustrate schematic cross-sectional views of an n$^+$-doped substrate 908 at different periods during manufacture of a vertical semiconductor device according to an embodiment.

Figure 9A:
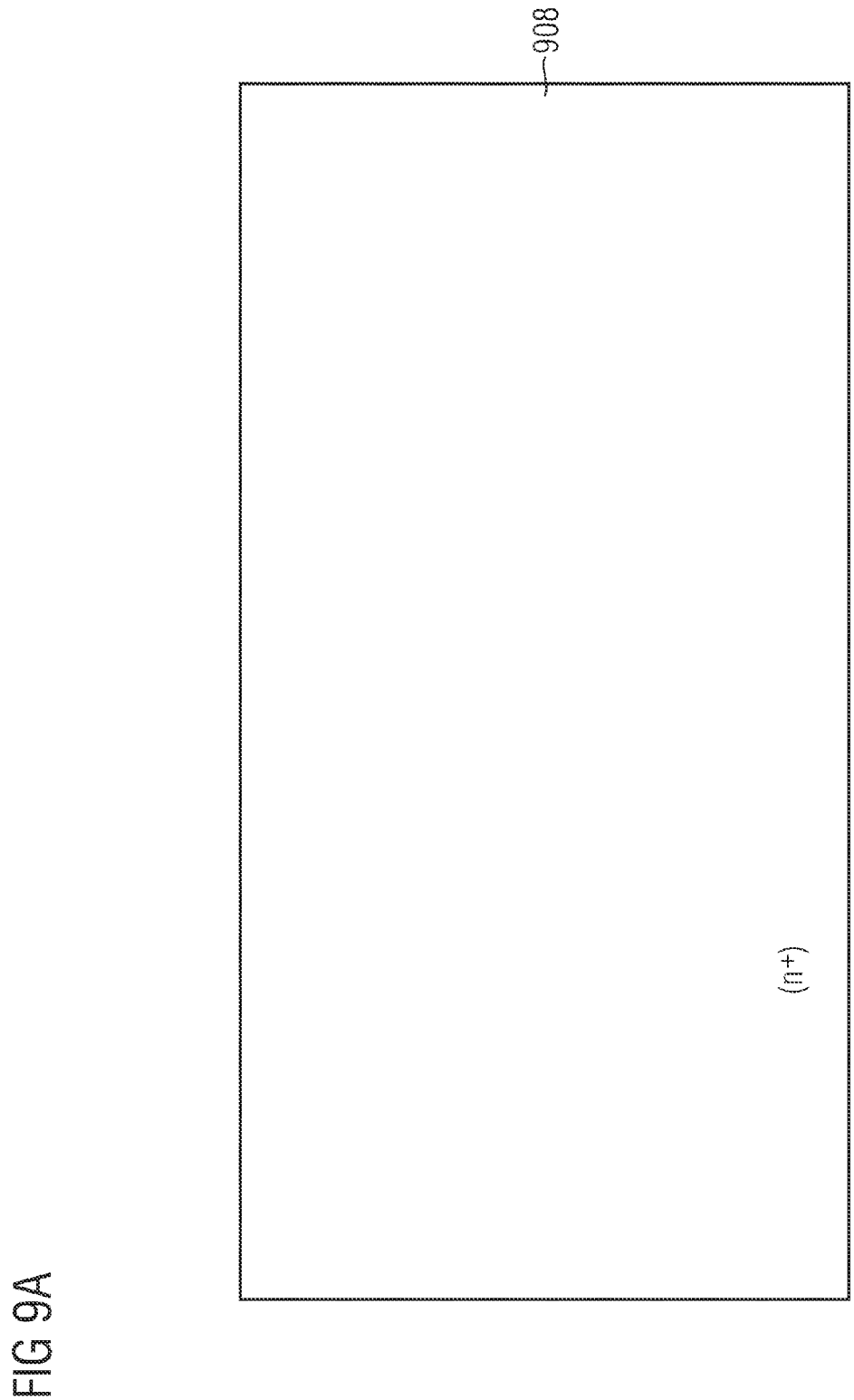

An n$^+$-doped substrate 908, e.g. n$^+$-doped silicon substrate including a doping concentration of e.g. at least $10^{18}$ cm$^{-3}$, as illustrated in FIG. 9A is subject to optional n-type dopant implantation on a surface thereof, e.g. at first side 906 as illustrated in FIG. 9B. Thus, an optional n-doped pedestal layer 909 is formed on the n$^+$-doped substrate 908. This results in a decrease in the voltage blocking capability of vertical semiconductor devices as well as a decrease in the on-state resistance of such devices.

Referring to the schematic cross-sectional view of the n$^+$-doped substrate of FIG. 9C, a mask layer 988, e.g. a hard mask layer is formed on the optional n-doped pedestal layer 909 and patterned, e.g. by lithography and etching. Then, the optional n-doped pedestal layer 909 and the n$^+$-doped substrate 908 are etched in those regions of the mask layer 988 that have previously been removed. As an example, etching of the optional n-doped pedestal layer 909 and the n$^+$-doped substrate 908 may be carried out as anisotropic etching using an appropriate method, e.g. dry etching. As a result of etching, trenches 902 are formed. The trenches 902 extend from a first side 906 through the optional n-doped pedestal layer 909 into the n$^+$-doped substrate 908.

Figure 9D:
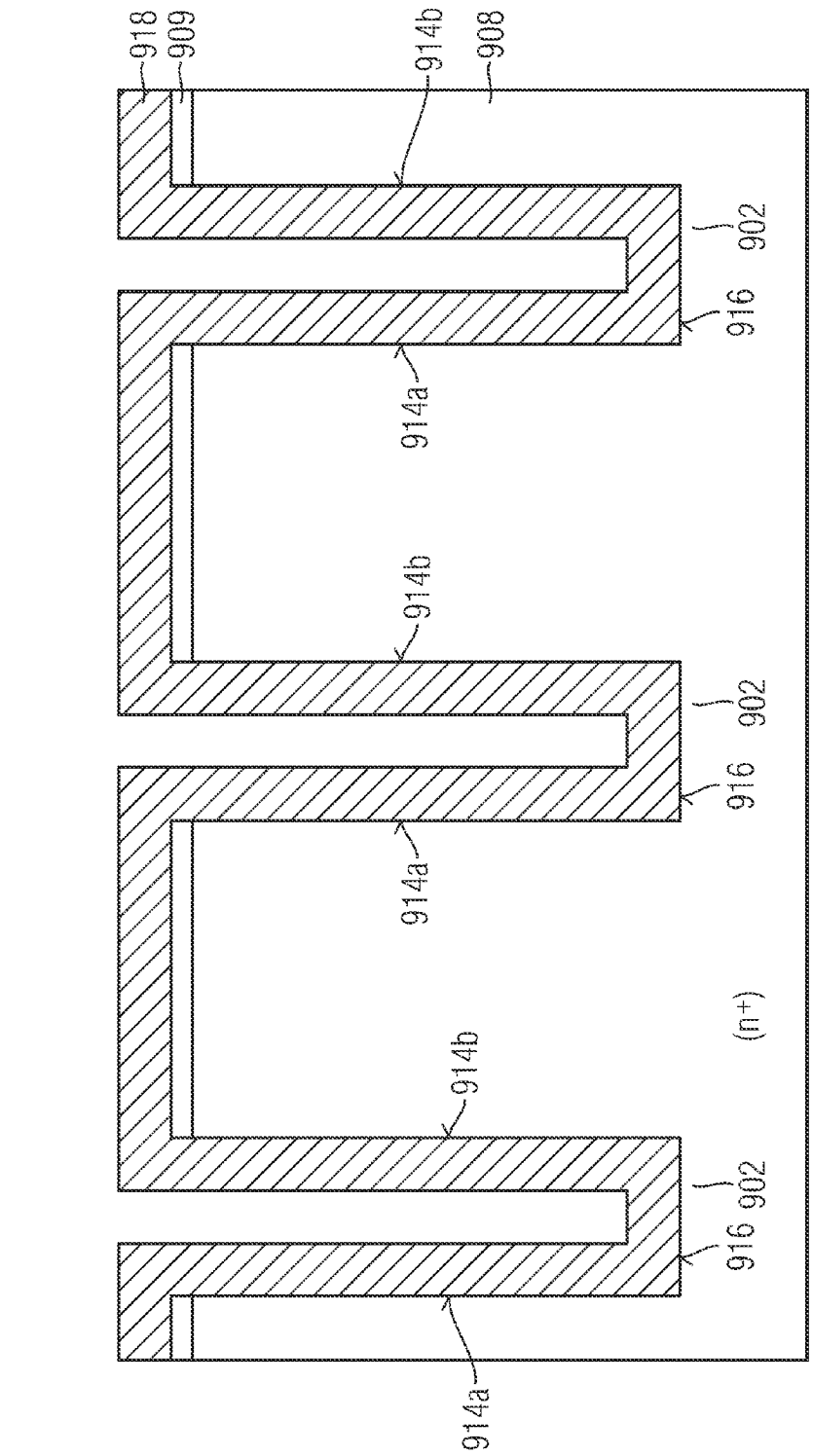

Referring to the schematic cross-sectional view of the n$^+$-doped substrate 908 illustrated in FIG. 9D, the mask layer 988 is removed, e.g. by etching, and a first n-doped semiconductor layer 918 is formed on a sidewall 914a, 914b as well as on a bottom side 916 of each of the trenches 902. As an example, the first n-doped semiconductor layer 918 may be formed by selective epitaxial growth.

Figure 9E:
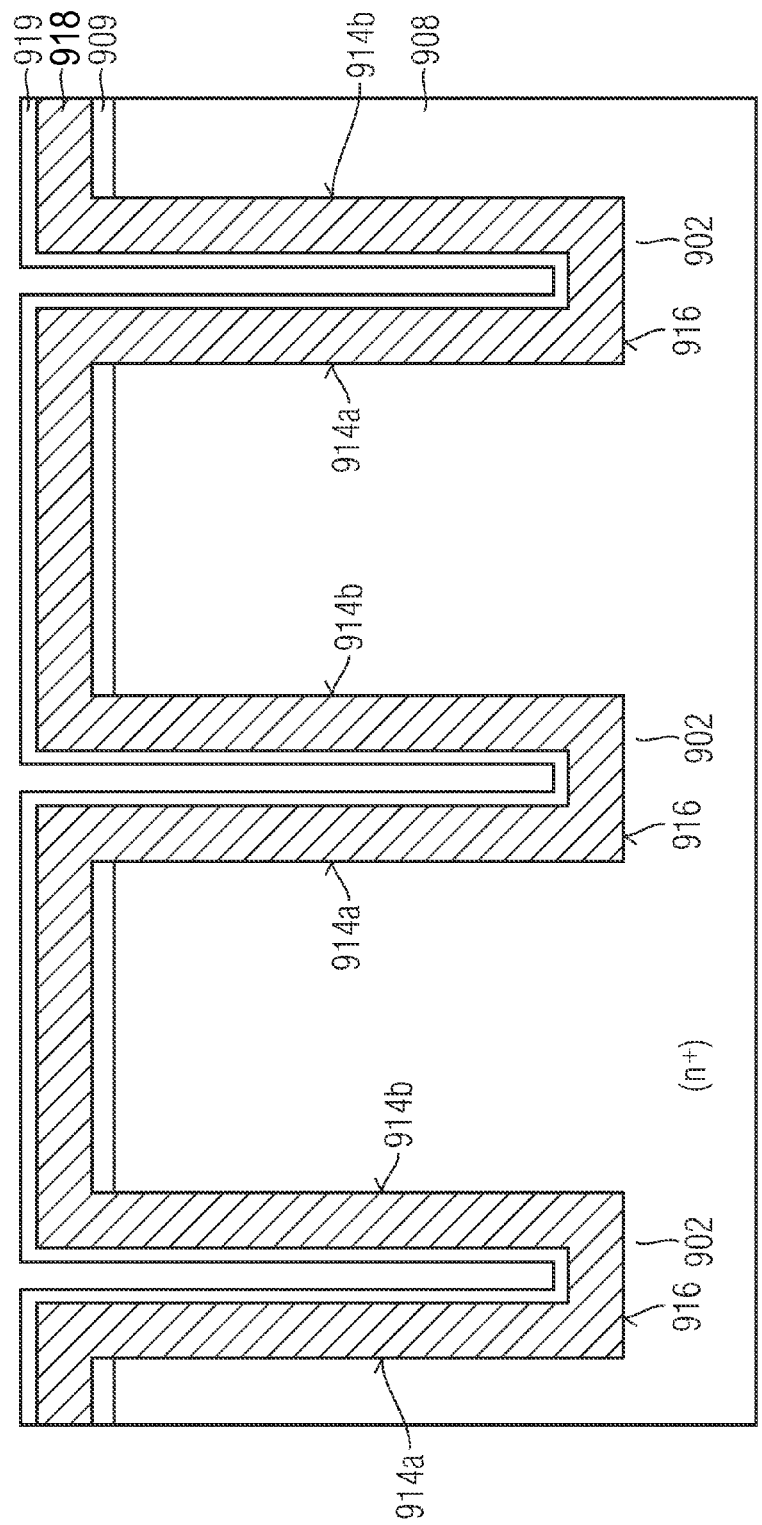

Referring to the schematic cross-sectional view of the n$^+$-doped substrate 908 illustrated in FIG. 9E, a dielectric layer 919, e.g. an oxide layer, is formed on the first n-doped semiconductor layer 918, e.g. by thermal growth or deposition.

Figure 9F:
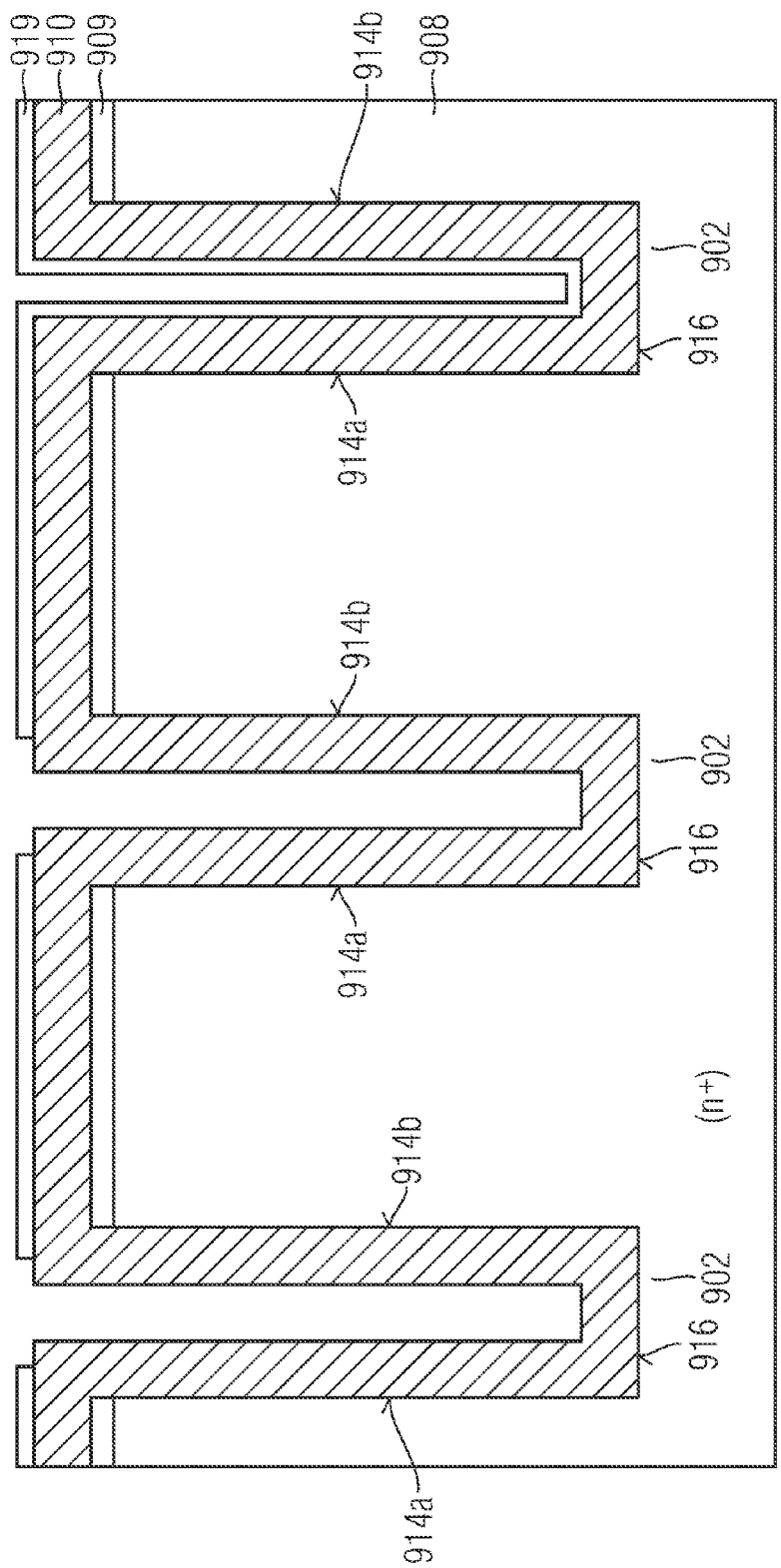

Referring to the schematic cross-sectional view of the n$^+$-doped substrate 908 illustrated in FIG. 9F, the dielectric layer 919 is removed in some of the trenches 902. The dielectric layer 919 is removed in those trenches 902 that will be further processed to include a pn junction diode therein.

Referring to the schematic cross-sectional view of the $n^+$-doped substrate 908 illustrated in FIG. 9G, the trenches 902 are filled with a second $p^+$-doped layer 920, e.g. $p^+$-doped polysilicon. As a further example, the trenches 902 may be filled with a layered stack of undoped and $p^+$-doped polysilicon to minimize lateral out diffusion of p-type dopants from the $p^+$-doped polysilicon into the first n-doped semiconductor layer 918.

Further process steps, e.g. formation of p-doped and/or n-doped semiconductor zones at the first side for manufacturing transistor cells, e.g. parts 122a, 122b of a transistor cell array as illustrated in FIG. 4, and other circuit blocks, e.g. circuit block 160 as illustrated in FIG. 4, follow. Likewise, the $n^+$-doped substrate 908 may be processed at a second side 912 opposite to the first side 906. As an example, the $n^+$-doped substrate 908 may be partially removed up to a bottom side of the trenches 902 and further dielectrics may be applied at the second side to provide electrically insulated part of the $n^+$-doped semiconductor substrate 908 as illustrated in FIG. 4. Further, conductive materials may be applied at the second side 912, for example.

In the embodiments described above, the conductivity type of semiconductor regions can also be vice versa to what is illustrated in the Figures, i.e. a p-type is an n-type and an n-type is a p-type.

In the embodiments described above, the first to third trenches are separated in a cross-sectional-view. In a plan view, these trenches may or may not merge.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e., the term MOSFET is used in the more general term meaning IGFET (insulated-gate field-effect transistor) and MISFET, respectively.

In the context of the present specification, the terms "metal" and "metallization" should be understood as including the more general term conductor. For example, the material of a gate electrode has not necessarily to be made out of metal but can also be made of any conducting material like e.g. a semiconductor layer or a metal-semiconductor compound or any other suitable material.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a transistor cell area in a semiconductor body of a first conductivity type;
a first trench in the transistor cell area between transistor cells, wherein
the first trench extends into the semiconductor body from a first side and includes a pn junction diode electrically coupled to the semiconductor body at a sidewall.

2. The semiconductor device of claim 1, wherein the first trench includes a first semiconductor layer of the first conductivity type lining sidewalls of the first trench, and a second semiconductor layer of a second conductivity type complementary to the first conductivity type adjoining the first semiconductor layer.

3. The semiconductor device of claim 2, wherein the first semiconductor layer lines a bottom side of the first trench.

4. The semiconductor device of claim 2, wherein a dielectric lines a bottom side of the first trench.

5. The semiconductor device of claim 2, wherein the semiconductor body is a silicon semiconductor substrate including a doping concentration of at least $10^{18}$ cm$^{-3}$, and the first semiconductor layer lines the first side of the semiconductor body.

6. The semiconductor device of claim 2, wherein at least a part of a drift zone of the transistor cells is in the first semiconductor layer.

7. The semiconductor device of claim 2, wherein the first semiconductor layer is a silicon semiconductor layer including a maximum doping concentration in a range between $10^{15}$ cm$^{-3}$ to $5\times10^{17}$ cm$^{-3}$.

8. The semiconductor device of claim 1, wherein a thickness of the first semiconductor layer ranges between 1 μm to 30 μm.

9. The semiconductor device of claim 2, wherein the second semiconductor layer is a polysilicon semiconductor layer.

10. The semiconductor device of claim 1, wherein a depth of extension of the first trench into the semiconductor body ranges between 20 μm and 250 μm.

11. The semiconductor device of claim 1, wherein a width of the first trench ranges between 5 μm and 70 μm.

12. The semiconductor device of claim 1, wherein a breakdown voltage of the pn junction diode is smaller than a breakdown voltage between a body region and a drift zone of the transistor cells.

13. The semiconductor device of claim 1, wherein the first trench extends through the semiconductor body to a second side.

14. The semiconductor device of claim 13, wherein a dielectric layer adjoins the pn junction diode in the first trench at the second side.

15. The semiconductor device of claim 1, further comprising a second trench extending into the semiconductor body from the first side, wherein the second trench includes a pn junction diode electrically coupled to the semiconductor body at a sidewall; and wherein a distance between the first trench and the second trench ranges between 20 μm and 200 μm.

16. The semiconductor device of claim 15, wherein an anode of the pn junction diode in the first trench is electrically connected to an anode of the pn junction diode in the second trench, and a cathode of the pn junction diode in the first trench is electrically connected to a cathode of the pn junction diode in the second trench.

17. The semiconductor device of claim 1, further comprising a second trench in the transistor cell area between transistor cells, wherein the second trench includes a pn junction diode electrically coupled to the semiconductor body at a sidewall; and wherein the pn junction diode in the second trench is a pn junction isolation structure configured to provide electrical isolation between a first part of the semiconductor body adjoining a first sidewall of the second trench and a second part of the semiconductor body adjoining a second sidewall of the second trench.

18. The semiconductor device of claim 17, wherein anodes of the pn junction diodes in the first and second trenches or cathodes of the pn junction diodes in the first and second trenches are electrically separated.

19. The semiconductor device of claim 1, further comprising a third trench extending through the semiconductor body from the first side to a second side, wherein the third trench includes a dielectric structure configured to provide electrical isolation between a first part of the semiconductor body adjoining a first sidewall of the third trench and a second part of the semiconductor body adjoining a second sidewall of the third trench.

20. An integrated circuit including the semiconductor device of claim 1.

21. A method of manufacturing a semiconductor device, comprising:
   forming a transistor cell area in a semiconductor body of a first conductivity type;
   forming a first trench in the transistor cell area between transistor cells, wherein
   the first trench extends into the semiconductor body from a first side and includes a pn junction diode electrically coupled to the semiconductor body at a sidewall.

22. The method of claim 21, wherein forming the transistor cell area and the first trench includes
   forming a first semiconductor layer of the first conductivity type on a doped semiconductor substrate of the first conductivity type;
   forming the first trench through the first semiconductor layer into the doped semiconductor substrate;
   forming a second semiconductor layer of the first conductivity type on sidewalls and on a bottom side of the first trench;
   forming a third semiconductor layer of a second conductivity type complementary to the first conductivity type in the first trench.

23. The method of claim 22, further comprising
   removing material of the doped semiconductor substrate from a second side opposite to the first side.

24. The method of claim 21, wherein forming the transistor cell area and the first trench includes
   forming the first trench into a doped semiconductor substrate of the first conductivity type;
   forming a first semiconductor layer of the first conductivity type on sidewalls and on a bottom side of the first trench and on the first side of the semiconductor body;
   forming a second semiconductor layer of a second conductivity type complementary to the first conductivity type in the first trench.

25. The method of claim 24, further comprising
   implanting dopants of the first conductivity type into the doped semiconductor substrate via the first side before forming the first trench.

* * * * *